(12) United States Patent
Diamond et al.

(10) Patent No.: US 9,455,395 B2
(45) Date of Patent: Sep. 27, 2016

(54) PIEZOELECTRIC ACTUATOR CONTROL FOR HIGH RATE OF OPERATION

(71) Applicant: EcoMotors, Inc., Allen Park, MI (US)

(72) Inventors: Michael Diamond, Thousand Oaks, CA (US); Michael Frick, Newbury Park, CA (US)

(73) Assignee: EcoMotors, Inc., Allen Park, MI (US)

( * ) Notice: Subject to any disclaimer, the term of this patent is extended or adjusted under 35 U.S.C. 154(b) by 146 days.

(21) Appl. No.: 14/152,672

(22) Filed: Jan. 10, 2014

(65) Prior Publication Data

US 2015/0200349 A1 Jul. 16, 2015

(51) Int. Cl.
H01L 41/04 (2006.01)
F02M 51/06 (2006.01)
F02D 41/20 (2006.01)
H02N 2/06 (2006.01)

(52) U.S. Cl.
CPC ......... *H01L 41/042* (2013.01); *F02D 41/2096* (2013.01); *F02M 51/0603* (2013.01); *H02N 2/067* (2013.01); *F02D 2041/2027* (2013.01); *F02D 2041/2058* (2013.01); *F02D 2041/2065* (2013.01)

(58) Field of Classification Search
CPC ... H02N 2/14; H01L 41/042; B06B 2201/55; B06B 1/0253; F02D 41/2096
USPC ....................................................... 318/116
See application file for complete search history.

(56) References Cited

U.S. PATENT DOCUMENTS

| | | | |
|---|---|---|---|
| 6,954,022 B2 * | 10/2005 | Kataoka | H02N 2/142 310/316.01 |
| 7,444,230 B2 | 10/2008 | Cheiky | |
| 7,546,826 B2 | 6/2009 | Cheiky | |
| 7,657,363 B2 | 2/2010 | Cheiky | |
| 7,743,754 B2 | 6/2010 | Cheiky | |
| 7,762,236 B2 | 7/2010 | Frick | |
| 7,945,375 B2 | 5/2011 | Cheiky | |
| 7,966,990 B2 | 6/2011 | Cheiky | |
| 7,992,545 B2 | 8/2011 | Frick | |
| 8,079,348 B2 | 12/2011 | Cheiky | |
| 8,116,963 B2 | 2/2012 | Plambeck | |
| 8,176,900 B2 | 5/2012 | Cheiky | |
| 2003/0164166 A1 * | 9/2003 | Takeuchi | F02D 41/0085 123/674 |
| 2010/0201291 A1 * | 8/2010 | Cheiky | F02D 41/2096 318/116 |
| 2010/0268440 A1 * | 10/2010 | Reichinger | F02D 41/2096 701/103 |
| 2013/0249445 A1 * | 9/2013 | Sumioka | H02N 2/008 318/116 |

* cited by examiner

Primary Examiner — Kawing Chan
Assistant Examiner — Bradley Brown
(74) Attorney, Agent, or Firm — Barnes & Thornburg LLP

(57) ABSTRACT

Described herein are methods for controlling a piezoelectric element, for example, for use in a fuel injector, safely and efficiently at higher frequencies without causing damage to the fuel injector due to excessive heating. Methods incorporating features of the present invention can utilize waveform generation, waveform scaling and power amplification to drive a piezoelectric element. In some embodiments, various operating conditions are utilized to determine a scaling value which is compared to a target value to determine the level of scaling to be utilized with a generated waveform.

11 Claims, 5 Drawing Sheets

PIEZOELECTRIC ACTUATOR CONTROL FOR HIGH RATE OF OPERATION

BACKGROUND OF THE INVENTION

1. Field of the Invention

The present invention relates generally piezoelectric elements and specifically to methods and devices for controlling the operation of such elements.

2. Description of the Related Art

Most modern internal combustion engines utilize a fuel injection system to deliver atomized fuel to the engine by forcibly pumping the fuel through small orifices under high pressure. These fuel injection systems tend to be more precise and efficient than previously used carburetors. Typical fuel injectors utilized in these systems often utilize hydraulically, electromagnetically, or piezoelectrically actuated injector pins.

A piezoelectric element uses a material that changes dimensions when a voltage is applied across the element. When the voltage is removed, the piezoelectric element returns to its original dimensions. When used as actuators, many piezoelectric elements are stacked together to form larger piezoelectric elements or "piezoelectric stacks" to increase the displacement of the actuator. In a piezoelectrically actuated fuel injector, one or more of these piezoelectric elements or piezoelectric stacks are used to move a fuel injector pin for fuel metering into an internal combustion engine. Various spring-like structures are often used in conjunction with these devices to apply a return force and thus facilitate the return of the fuel injector pin to its "resting" position after the actuating energy is no longer applied to the piezoelectric stack.

Piezoelectric actuators are typically either voltage driven or current driven. Such actuators operate optimally at low actuation frequencies, but are limited to operating frequencies of no greater than about 100 hertz (Hz). At higher frequencies, the energy losses in the piezoelectric element cause self-heating of the piezoelectric stack. As the piezoelectric element's temperature increases, so does the piezoelectric element's capacitance. This capacitance increase in turn increases the charge required to operate the piezoelectric actuator. The increased charge requirement further increases heating and a phenomenon known as "thermal runaway" results. Thermal runaway involves the increasing capacitance resulting in increased current and increased heating which forms a positive feedback loop. This positive feedback loop ultimately raises the temperature of the piezoelectric actuator past the level where it can be optimally and/or safely operated.

An efficient method of control that allows the piezoelectric element to be efficiently and safely operated at higher frequencies without deleterious effects is thus needed.

SUMMARY

Described herein are piezoelectric control methods and devices, such as drivers, that allow a piezoelectric element, for example, a piezoelectric element in a fuel injector, to be safely and efficiently operated at higher frequencies without deleterious effects such as damage to the fuel injector due to excessive heating. Methods and devices incorporating features of the present invention can comprise utilizing waveform generators, waveform scaling modules and power amplifiers.

In some embodiments, methods and devices use measurements, such as measurements of electrical properties, such as frequency and/or piezoelectric element current, taken during operation of the piezoelectric element to determine a level by which to modify the electric activation signal sent to the piezoelectric element to reduce heating. This allows the piezoelectric element to be safely and efficiently operated at higher frequencies, for example, frequencies of at least 200 Hz, without causing deleterious effects to the piezoelectric element or other portions of the fuel injector.

In one embodiment incorporating features of the present invention, a method of operating a piezoelectric element comprises the steps of generating a first waveform from an input pulse, where this waveform has measurable waveform features, measuring operating parameters of the piezoelectric element and comparing these operating parameters to target values for the operating parameters and to the measurable waveform features, scaling the first waveform to more closely match the target value, thus producing a scaled output waveform, and, optionally, amplifying the scaled output waveform to a level sufficient to drive the piezoelectric element.

In another embodiment incorporating features of the present invention, a method of operating a piezoelectric element comprises the steps of generating a waveform having a frequency from an input pulse and measuring the frequency, then determining a scaling value by comparing the frequency of the waveform to a critical frequency value. If the measured frequency is less than the critical frequency value the waveform is not modified. If the frequency is greater than the critical frequency value, piezoelectric current is divided by the waveform frequency to determine a reference value and the reference value is compared to a target value. If the reference value is equal to the target value, then the waveform is not modified. If the reference value is greater than the target value, a scaling factor is determined for use in decreasing a feature of the waveform; if the reference value is less than said target value, then the scaling value is determined for use to increase a feature of the waveform. The waveform is then modified by applying the scaling value to provide a scaled output waveform.

In yet another embodiment incorporating features of the present invention, a piezoelectric element driver comprises a waveform generator configured to receive a digital input and produce a waveform output, a scaling module configured to receive the waveform output and generate a scaled output waveform, and a power amplifier configured to receive the scaled output waveform and generate an amplified waveform.

These and other features and advantages of the invention would be apparent to those skilled in the art based on the following detailed description, taken together with the accompanying drawings, in which:

DETAILED DESCRIPTION

Figure 1:
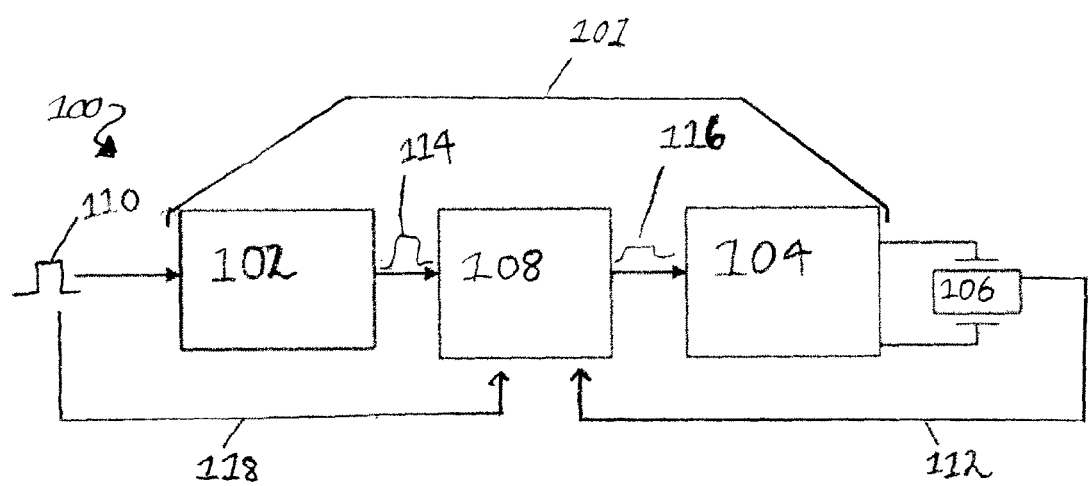
FIG. 1 is a schematic representation of a system wherein flow of signals communicated through components of an input pulse stream control output of a piezoelectric component system incorporating features of the present invention.

Described herein are piezoelectric control methods that allow a piezoelectric element utilized in a fuel injector to be safely and efficiently operated at frequencies higher than normal without deleterious effects such as damage to the piezoelectric element due to excessive heating. These methods can include monitoring various factors and utilizing the information obtained to adjust the activation signal to the piezoelectric element in a corresponding manner. The activation signal can be adjusted in various ways. For example, the signal output of one or more components connected in signal communication flow with one another can be altered, such as by use of a waveform generator and a power amplifier. These various features can be controlled by a vehicle's Engine Control Unit ("ECU").

Methods incorporating features of the present invention use measurements, such as electrical measurements, of various factors, such as frequency and/or piezoelectric element current, during operation of the piezoelectric element. While methods incorporating features of the present invention describe in detail the use of operating parameters such as charge, current and voltage in the calculation of the degree of modification of the electric activation signal sent to the piezoelectric element, it is understood that other operating parameters relevant to piezoelectric element operation and potential unwanted deleterious effects can be utilized. Measurements of these operating parameters can be obtained by utilizing various sensor devices that are known in the art. The measured values can also be communicated to a vehicle's ECU which can run calculations based upon those values and activate and/or adjust various features such as waveform generators and power amplifiers as discussed above.

In some embodiments, a waveform scaling module is utilized. A waveform scaling module can be any device that is known in the art for adjusting or varying a waveform, for example, by multiplying the amplitude by a certain value. The waveform scaling module can be configured to adjust the amplitude by a desired value when a particular signal is received indicating a certain relevant measurable value, for example, charge, frequency and/or current of a piezoelectric element has reached a certain level.

Throughout this disclosure, the preferred embodiments herein and examples illustrated are provided as exemplars, rather than as limitations on the scope of the present disclosure. As used herein, the terms "invention," "method," "present method" or "present invention" refers to any one of the embodiments incorporating features of the invention described herein, and any equivalents. Furthermore, reference to various feature(s) of the "invention," "method," "present method" or "present invention" throughout this document does not mean that all claimed embodiments or methods must include the referenced feature(s).

It is also understood that when an element or feature is referred to as being "on" or "adjacent" another element or feature, it can be directly on or adjacent the other element or feature or intervening elements or features that may also be present. Furthermore, relative terms such as "outer", "above", "lower", "below", and similar terms, may be used herein to describe a relationship of one feature to another. It is understood that these terms are intended to encompass different orientations in addition to the orientation depicted in the figures.

Although the terms first, second, etc. may be used herein to describe various elements or components, these elements or components should not be limited by these terms. These terms are only used to distinguish one element or component from another element or component. Thus, a first element or component discussed below could be termed a second element or component without departing from the teachings of the present invention. As used herein, the term "and/or" includes any and all combinations of one or more of the associated list items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments of the invention. As such, variations from the illustrated signal flow, for example, are contemplated. Embodiments of the invention should not be construed as limited to the particular illustrated embodiments herein but are to include deviations may be necessary to adopt to a different engine design.

Embodiments according to the present disclosure can be utilized with various fuel injection systems, including injection systems utilizing fuels under heated and/or supercritical conditions, examples of which are set forth in the following patent documents, including their drawings, schematics, diagrams and related written description: U.S. Pat. No. 8,402,951 U.S. Pat. No. 8,176,900; U.S. Pat. No. 8,116,963; U.S. Pat. No. 8,079,348; U.S. Pat. No. 7,992,545; U.S. Pat. No. 7,966,990; U.S. Pat. No. 7,945,375; U.S. Pat. No. 7,762,236; U.S. Pat. No. 7,743,754; U.S. Pat. No. 7,657,363; U.S. Pat. No. 7,546,826; and U.S. Pat. No. 7,444,230. These documents are hereby incorporated herein in their entirety by reference.

FIG. 1 is a schematic representation of signal communication 100 depicting the flow of signals through a waveform generator 102, a power amplifier 104 and a piezoelectric element 106 of a fuel injector. A piezoelectric driver 101 can comprise a waveform generator 102, a power amplifier 104 and a waveform scaling module 108. The waveform scaling module 108 is placed in the communication flow between the waveform generator 102 and the power amplifier 104. The waveform scaling module 108 can alter the amplitude of the waveform, while not altering the general shape of the waveform, in response to monitored operating parameters, such as power, current, voltage or in response to commands received from other electronic systems such as an engine management system.

The waveform scaling module 108 can reduce the drive voltage to the piezoelectric element 106 in response to the monitored parameters or in response to commands from other engine control components. The reduced drive voltage can lower the amount of power dissipated in the piezoelectric element 106, thus minimizing temperature increase of the piezoelectric element 106.

As shown in FIG. 1, the waveform generator 102 can produce a desired voltage waveform 114 in response to an input pulse 110, thus generating a desired width and/or shape of the output waveform 114. The waveform scaling module 108 multiples the waveform 114 by a value determined by monitored parameters and/or received commands. The resulting scaled waveform 116 can then be amplified by a power amplifier 104, with a fixed gain, to the level required to drive the piezoelectric actuator 106.

The monitored operating parameters used to make scaling decisions may include, but are not limited to, piezoelectric current, amplifier current, amplifier power, temperature, operating frequency, or any combination of parameters. The information received from the input pulse signal 118 and the piezoelectric current signal 112 can be utilized in several ways. For example, in one embodiment, the amplifier power input is divided by the operating frequency. Ignoring energy losses, the resulting value is proportional to charge. By keeping charge consistent, a constant piezoelectric actuation stroke can be delivered. The waveform scaling module 108 can compare the charge value to a desired value and provide a modified output waveform 114 to make the actual charge match the desired value.

Below a certain threshold frequency the problem of thermal runaway is minimal and additional control is not needed. At these lower frequencies, waveform scaling is not needed and the waveform scaling module 108 can be configured to pass the signal from the waveform generator 102 to the power amplifier 104 without scaling. In other embodiments, the output waveform 114 can pass through the waveform scaling module 108 when the module is powered off or otherwise rendered inert.

Other control strategies can be implemented. For example, instead of, or in addition to attempting to more directly regulate current or power, current or power can be allowed to rise until a threshold is reached and the scaling value changed to a smaller value. Likewise, control may be based on crossing a frequency threshold. Once the frequency threshold is reached, the scaling value may be set, dependent on frequency, or just reduced to a fixed value. An extension of this control scheme is to use several thresholds and several scaling values. In other embodiments, the action of the scaling module can be controlled by signals supplied by other engine control electronics, for example, a model based control running in the ECU.

Figure 2:
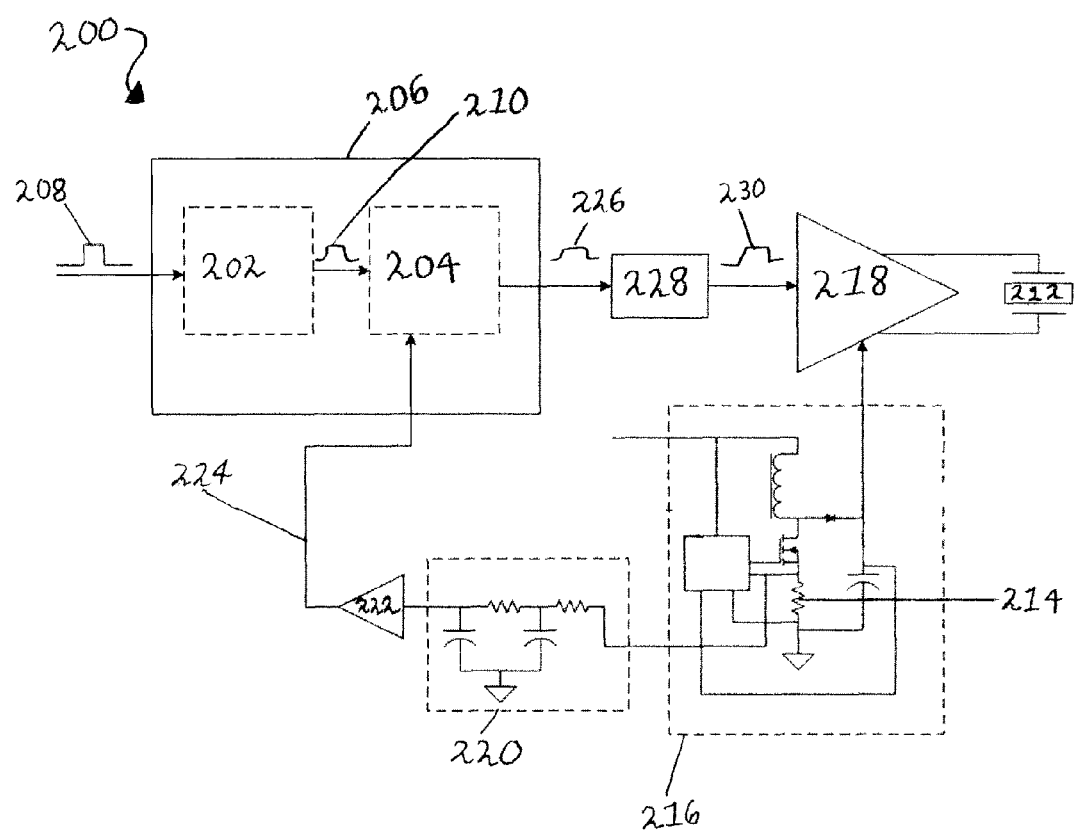
FIG. 2 is a schematic representation of a system incorporating features of the present invention, wherein a flow of signals communicated through components of an input pulse stream control output of a piezoelectric component system.

FIG. 2 is a schematic representation of another embodiment of a signal communication 200 incorporating features of the present invention. As shown in FIG. 2, a waveform generator module 202 and a scaling module 204 are software modules residing in a microprocessor 206. When data relating to an input pulse 208 is received by the waveform generator module 202, the waveform generator module produces a digital waveform 210 suitable for use with a piezoelectric element 212, incorporating features which limit elements such as rise and fall times and which mitigate bounce.

With continued reference to FIG. 2, the digital version of the waveform 210 can then be scaled by the scaling software module 204. The scaling software module 204 can utilize the operating frequency, as determined from the pulse input stream, as well as the voltage sensed across a sensor, for example, a current sensing resistor 214. This resistor 214 can be part of a high voltage power supply 216, which can be used to supply power to a power amplifier 218. The power supply 216 can comprise a "flyback boost" converter. The current measurement obtained from a current sensing resistor 214 can be related to the power output of the power supply 216.

The voltage across the current sensing resistor 214 can be filtered by a filter 220 and can then be amplified by an amplifier 222, as the signal level is typically low, to provide the signal 224. This signal 224 is then sent to the scaling module 204 in the microprocessor 206, where the scaling module 209 can divide the value of the signal 224 by the frequency, thus producing a scaling value. The resulting scaling value can then be compared to a desired target value, for example, a value corresponding to an optimal drive condition, for example an optimal drive current, for the piezoelectric element 212. If the result is higher than the target value, the scaling value can be decreased. If the value is less than the target, the scaling value can be increased. The waveform 210 can then be multiplied by the scaling value. The scaling module 204 can be configured not to scale the waveform 210 when the operating frequency is below a desired specified value. In some embodiments, this desired specified value is set to around 100 Hz.

The digital output 226 of the scaling module 204 can then be sent to a digital to analog (D/A) converter 228, where it is converted to an analog output voltage 230. The analog output voltage 230 from the D/A converter 228 can then be applied to the input of the power amplifier 218, which can amplify the output voltage 230. In some embodiments, the power amplifier amplifies the output voltage 230 from a signal level of around 0-5 Volts to the higher voltage signal (around 6-200 volts) which is typically optimal to drive the piezoelectric element 212. The power amplifier 218 can be implemented in a variety of configurations. For example, the power amplifier 218 can comprise a linear amplifier or a switching amplifier. In some embodiments, the power amplifier comprises a linear amplifier or can be configured to have characteristics similar to a linear amplifier.

It is understood that while the control inputs useable in FIG. 2 include power, supply power and frequency, other control inputs providing relevant information can be utilized, for example, piezoelectric current. The scaling value can be generated by other engine control electronics and sent to this piezoelectric driver as a digital signal.

Figure 3:
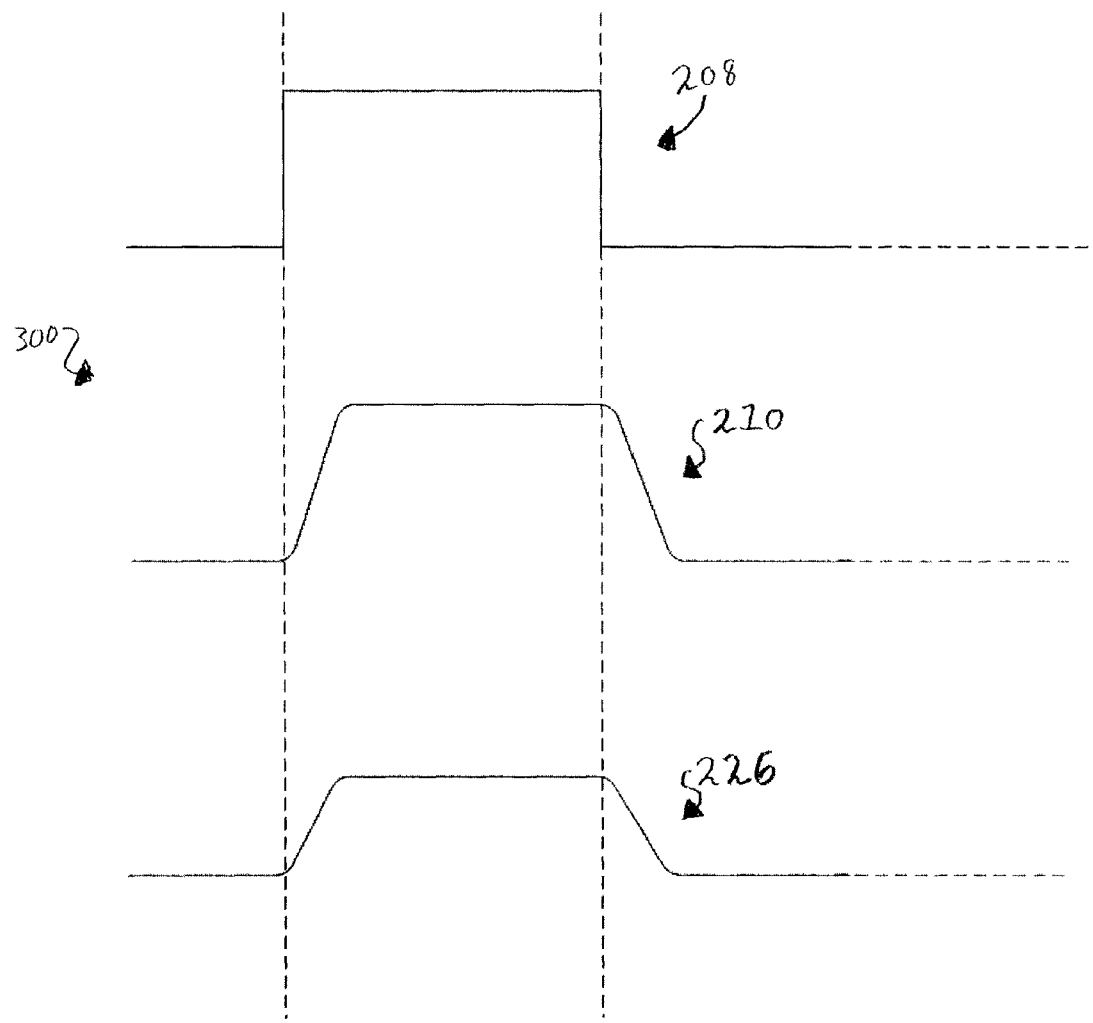
FIG. 3 is a comparison showing various signal waveforms at different points in the flow of signals depicted in FIG. 2.

FIG. 3 is a graph 300 comparing three inputs and output signals discussed above in regard to FIG. 2 including the input pulse 208, the digital waveform 210 provided by the waveform generator module 202, and the digital output 226 from the scaling module. As seen in FIG. 3, the above method of FIG. 2 results in a significant scaling of the amplitude and a change in the output signal appearance of the initial input pulse 208 to the digital output 226 of the scaling module 204.

Figure 4:
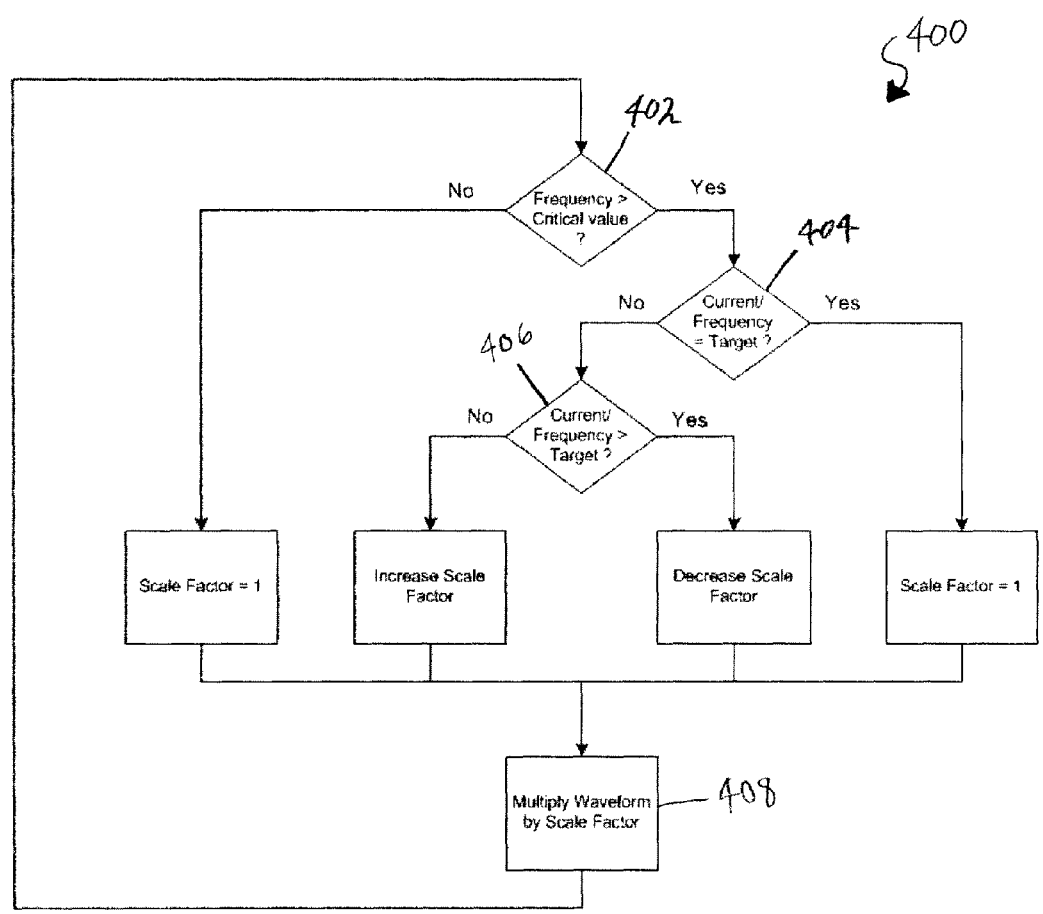
FIG. 4 is a schematic representation showing decision points and responses in an example method of piezoelectric actuator operation incorporating features of the present invention.

FIG. 4 depicts an example of a logic flow schematic 400 for one method of driving a piezoelectric element incorporating features of the present invention. The logic flow schematic 400 sets forth a method for determining a scaling value to apply to a waveform. In a first step 402, the frequency of the waveform, for example, a waveform generated in response to an input pulse by a waveform generator as discussed above, is compared to a critical value. The critical value can be any desired relevant value, for example, an optimal operating condition for a piezoelectric actuator or a threshold value relating to a safe and/or efficient operating level for a piezoelectric actuator. In the embodiment shown, the comparison between frequency and critical value includes inquiring whether the frequency is greater than the critical value. If the answer is "no," then the scaling value remains unaltered. If the answer is "yes," then the process proceeds to a second step 404.

In the second step 404, current is divided by frequency to generate a reference value. This reference value is then compared to a target value. Like the critical value above, the target value can correspond to any desired relevant value to adjust the waveform for operation of a piezoelectric actuator. If the reference value is equal to the target value, then the scaling value remains unaltered. If the reference value is not equal to the target value, then the process proceeds to a third step 406.

In the third step 406, the reference value is compared to the target value. If the reference value is less than the target value, then the scaling factor is increased, if the reference value is greater than the target value, then the scaling factor is decreased and the process proceeds to a fourth step 408. In the fourth step 408, the scaling value is applied to the waveform, for example, by multiplying the waveform by the scaling factor. The logic flow schematic 400 then resets to the first step 402 for continuous monitoring.

Figure 5:
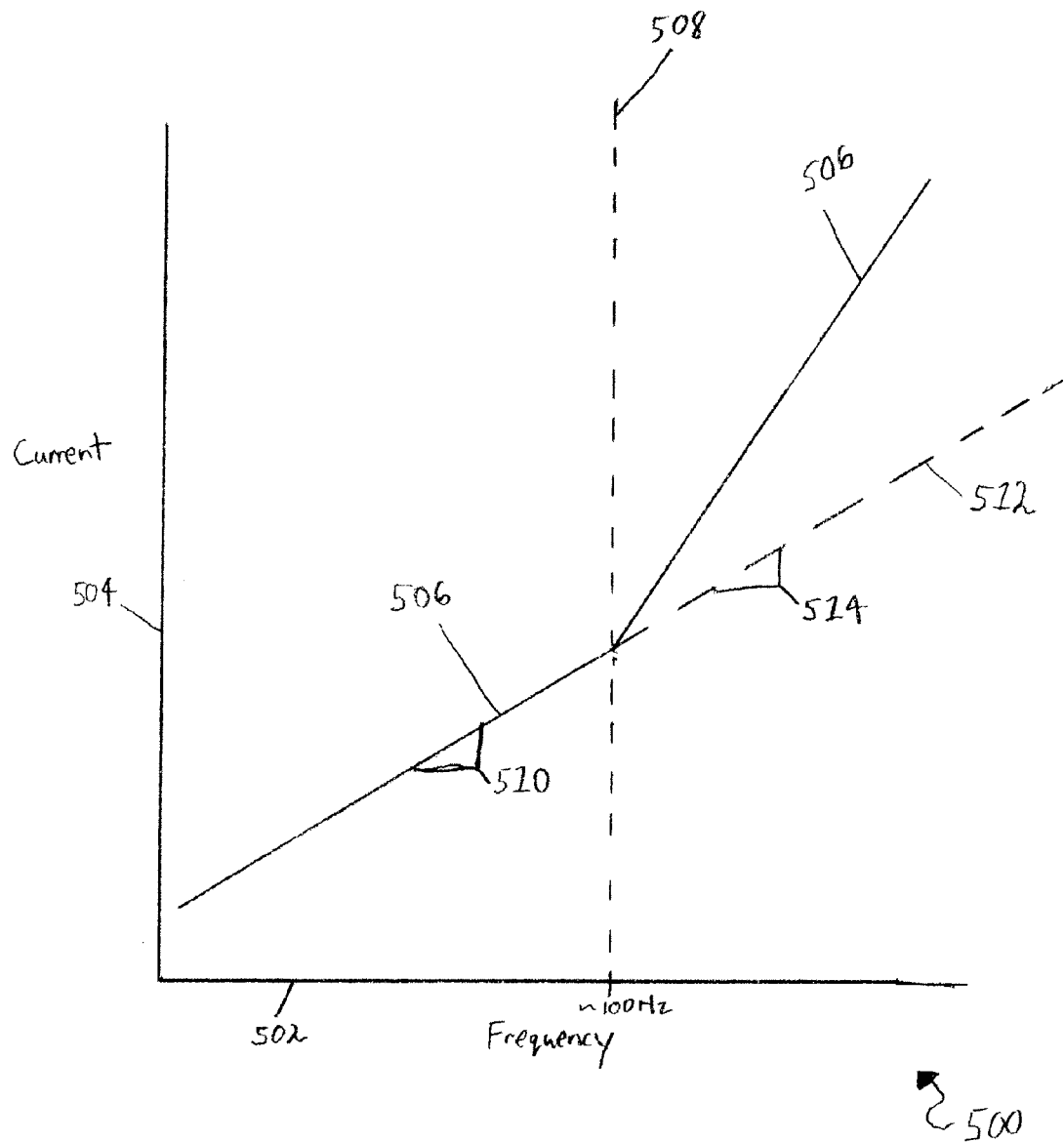
FIG. 5 is a graph of current versus frequency showing an embodiment of a scaling process incorporating features of the present invention.

Target values and reference values incorporating features of the present invention are now examined in further detail. FIG. 5 shows a graph 500 where operating frequency is plotted on the x-axis 502 and current is plotted on the y-axis 504. A base line 506 shows the typical operating conditions for a piezoelectric actuator. As shown in the graph 500, at a certain operating frequency threshold point 508, for example at approximately 100 Hz for many piezoelectric elements, capacitance causes an increase in current needed to continue operation at that high-frequency level, this results in the thermal runaway issues discussed above. This is reflected in base line 506 by a significant change in the slope after exceeding the frequency threshold point 508.

In regard to of FIG. 5, a reference value can be determined by examining the initial slope 510 of the base line 506 (the slope prior to the crossing of the threshold point 508). This initial slope has a value determined by dividing current by frequency and accurately reflects the power utilized by the piezoelectric actuator under optimal operating conditions prior to the threshold point 508 operating conditions. Subsequent to crossing the threshold point 508, a target value for current or voltage can be determined that results in a continuation of the pre-threshold point slope conditions of base line 506, to provide an extrapolated ideal line 512, which is a continuation of base line 506. Essentially, the post-threshold point 508 base line 506 can be scaled to have a value more closely matching ideal line 512.

The slope 514 of the ideal line 512 can be used to determine a current-level target value. The slope is equal to current divided by frequency. The frequency can be measured and in response thereto an appropriate current can be selectively applied such that the slope 514 of the ideal line 512 more closely matches the first slope 510 of the base line 506. One way of controlling current is by altering voltage in the system. A scaling value would thus be the required value to scale the post-threshold point 508 base line 506 to more closely match the ideal line 512. This scaling can also be accomplished by adjusting the amplitude of the waveform accordingly.

Although the present invention has been described in detail with reference to certain preferred configurations thereof, other versions are possible. Embodiments of the present invention can comprise any combination of compatible features shown in the various figures, and these embodiments should not be limited to those expressly illustrated and discussed. Therefore, the spirit and scope of the invention should not be limited to the versions described above.

The foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

We claim:

1. A method of operating a piezoelectric element comprising the steps of:
    generating a first waveform from an input pulse, said waveform having measurable features;
    measuring operating parameters of said piezoelectric element and comparing said operating parameters to target values for said operating parameters and to said measurable features of said waveform;
    scaling said first waveform so that the features thereof more closely match said target values, wherein said scaling of said first waveform comprises using a scaling value to modify the amplitude of the first waveform, and wherein said scaling value is determined by dividing power input by operating frequency;
    producing a scaled output waveform; and
    amplifying said scaled output waveform to provide a current of voltage level sufficient to drive said piezoelectric element.

2. The method of claim 1, wherein said measurable operating features of said waveform include frequency.

3. The method of claim 1, wherein said measured piezoelectric operating parameters include piezoelectric current.

4. The method of claim 1, wherein said target value comprises a target current value.

5. The method of claim 1, wherein the shape of the waveform is not modified by scaling.

6. The method of claim 1, wherein software modules are used to scale the first waveform to generate a modified waveform.

7. The method of claim 1, wherein said scaled output waveform is digital and a digital analog (D/A) converter is used to convert said scaled output waveform to an analog signal prior to amplifying said scaled output waveform.

8. A piezoelectric element driver comprising:
    a waveform generator configured to receive a digital input and produce a waveform output;
    a scaling module configured to receive said waveform output and generate a scaled output waveform, wherein said scaling module is configured to receive information, and depending on said received information, generating a scaling value for use in modifying said waveform, and wherein said scaling module is configured to divide piezoelectric power by operating frequency to generate said scaling value and then to compare said scaling value to a target value; and
    a power amplifier configured to receive said scaled output waveform and generate an amplified waveform.

9. The driver of claim 8, wherein received information comprises one or more operating parameters, said one or more operating parameters used to generate the scaling value.

10. The driver of claim 9, wherein said one or more operating perimeters include piezoelectric actuator temperature.

11. The driver of claim 8, wherein said scaling value is set to a constant value below a specified frequency.

* * * * *